United States Patent
Kim (10) Patent No.: US 6,811,932 B1
(45) Date of Patent: Nov. 2, 2004

(54) METHOD AND SYSTEM FOR DETERMINING FLOW RATES FOR CONTACT FORMATION

(75) Inventor: Hung-Eil Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 197 days.

(21) Appl. No.: 10/165,383

(22) Filed: Jun. 6, 2002

(51) Int. Cl.[7] .............................. G03F 9/00; G03F 7/00
(52) U.S. Cl. .............................. 430/5; 430/22; 430/30; 430/311
(58) Field of Search ................................ 430/5, 22, 30, 430/311; 356/393, 394; 700/121; 716/19–21

(56) References Cited

U.S. PATENT DOCUMENTS 6,117,622 A * 9/2000 Eisele et al. ................ 430/322

2003/0213613 A1 * 11/2003 Strozewski et al. ........... 716/19

* cited by examiner

*Primary Examiner*—Mark F. Huff
*Assistant Examiner*—Kripa Sagar
(74) *Attorney, Agent, or Firm*—Winstead Sechrest & Minick P.C.

(57) ABSTRACT

A method and system for determining a mask for fabricating semiconductor device is described. The method and system include patterning a resist layer on at least one mask material to provide a patterned resist layer. The patterned resist layer has a plurality of apertures therein. The plurality of apertures is for the plurality of features. The plurality of apertures has a plurality of apertures sizes and a plurality of aperture pitches. The method and system also include providing a test mask for a plurality of features using the resist layer. The test mask has the plurality of apertures therein. The method and system also include determining a plurality of flow rates for the plurality of aperture pitches and the plurality of aperture sizes based upon the plurality of features.

7 Claims, 8 Drawing Sheets

METHOD AND SYSTEM FOR DETERMINING FLOW RATES FOR CONTACT FORMATION

FIELD OF THE INVENTION

The present invention relates to semiconductor devices, and more particularly to a method and system for determining the flow rate in order to form contacts in a semiconductor device.

BACKGROUND OF THE INVENTION

In order to provide contacts in a conventional semiconductor device, a conventional mask is used. The conventional mask is used in conjunction with a light source to develop a pattern on a photoresist mask on a semiconductor device. Light is diffracted by the mask to expose portions of a layer of photoresist on the semiconductor device. The mask material typically includes a phase shift material and/or chromium which lie on a quartz substrate. The conventional mask has apertures in the regions in which the contacts are to be formed. Once the photoresist mask on the semiconductor device is patterned, exposed portions of the semiconductor device can be etched to form contact holes, then refilled with a conductive material to form contacts. The mask itself is formed by patterning a layer of resist on mask materials. To form the conventional mask, portions of the resist layer are removed. The underlying mask material (s) are etched, thereby forming apertures in the conventional mask.

Although the conventional method for forming contacts in a semiconductor device functions, one of ordinary skill in the art will readily recognize that the contacts formed may have a different size than desired. During fabrication of the conventional mask, the resist on the mask materials may shrink. The rate of the shrinkage of the resist is known as the flow rate. Because of the flow rate, the size of the apertures in the mask may be different than desired. The size of the contacts formed may, therefore, be different than desired. Because the contacts do not have the desired dimension, the performance of the semiconductor device may suffer.

Accordingly, what is needed is a system and method for providing a semiconductor device having contacts with the desired dimensions. The present invention addresses such a need.

SUMMARY OF THE INVENTION

The present invention provides a method and system for determining a mask for fabricating semiconductor device. The method and system comprise patterning a resist layer on at least one mask material to provide a patterned resist layer. The patterned resist layer has a plurality of apertures therein. The plurality of apertures is for the plurality of features. The plurality of apertures has a plurality of apertures sizes and a plurality of aperture pitches. The method and system also comprise providing a test mask for a plurality of features using the resist layer. The test mask has the plurality of apertures therein. The method and system also comprise determining a plurality of flow rates for the plurality of aperture pitches and the plurality of aperture sizes based upon the plurality of features.

According to the system and method disclosed herein, the present invention allows the flow rates for a mask to be determined for different sizes and pitches of features, allowing a user to correct for the flow rates when fabricating the mask.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be to accorded the widest scope consistent with the principles and features described herein.

The present invention provides a method and system for determining a mask for fabricating semiconductor device. The method and system comprise patterning a resist layer on at least one mask material to provide a patterned resist layer. The patterned resist layer has a plurality of apertures therein. The plurality of apertures is for the plurality of features. The plurality of apertures has a plurality of apertures sizes and a plurality of aperture pitches. The method and system also comprise providing a test mask for a plurality of features using the resist layer. The test mask has the plurality of apertures therein. The method and system also comprise determining a plurality of flow rates for the plurality of aperture pitches and the plurality of aperture sizes based upon the plurality of features. An optical proximity correction can then be determined for at least one feature at a particular aperture size and pitch.

The present invention will be described in terms of methods including particular steps. Furthermore, for clarity, some steps are omitted. One of ordinary skill in the art will, therefore, readily recognize that this method and system will operate effectively for other methods having different and/or additional steps. The present invention is also described in conjunction with a semiconductor device having certain components. However, one of ordinary skill in the art will readily recognize that the present invention is consistent with a semiconductor device having other and/or different components. For example, the present invention is described in the context of providing contacts. However, one of ordinary skill in he art will readily recognize that the present invention can be extended to other features of a semiconductor device.

Figure 1:
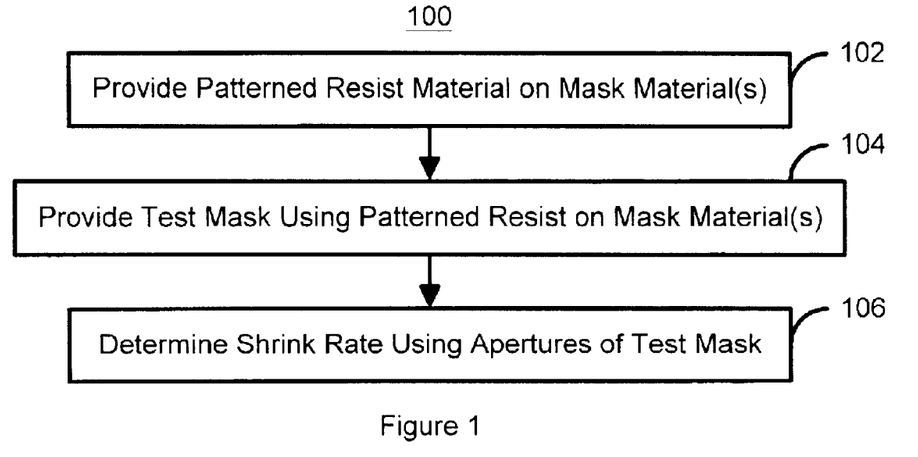
FIG. 1 is a flow chart of one embodiment of a method in accordance with the present invention for determining a flow rate for a mask in accordance with the present invention.

To more particularly illustrate the method and system in accordance with the present invention, refer now to FIG. 1, which depicts a flow chart of one embodiment of a method 100 in accordance with the present invention for determining a flow rate for a mask in accordance with the present invention. A patterned resist layer is provided on one or more mask materials, via step 102. The patterned resist layer includes features, preferably contacts, of different sizes and different pitches. In a preferred embodiment, the features are in arrays, with each array having a specific pitch and contact size. In addition, in a preferred embodiment, each array has different patterns. A test mask is formed using the patterned resist layer, via step 104. Step 104 includes etching through the mask layers using the patterned resist layer as a mask. Like the patterned resist layer, the test mask includes the apertures having different sizes and different pitches. In a preferred embodiment, the test mask includes arrays of apertures for contacts, with each array having a specific pitch and aperture (contact) size. Once the test mask has been provided, the flow rates for the patterned resist can be determined for the pitches and sizes, via step 106.

Figure 2A:
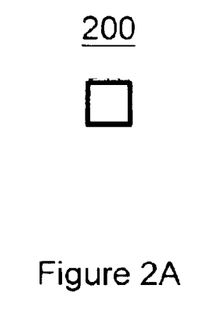
FIG. 2A depicts one embodiment of a first, single contact, pattern to be provided in the test mask.
Figure 2B:
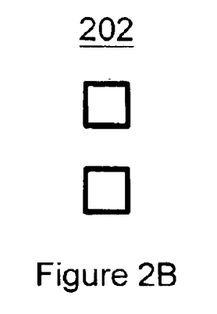
FIG. 2B depicts one embodiment of a second, twin contact, pattern to be provided in the test mask.
Figure 2C:
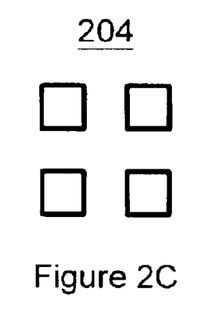
FIG. 2C depicts one embodiment of a third, 2×2, pattern to be provided in the test mask.
Figure 2D:
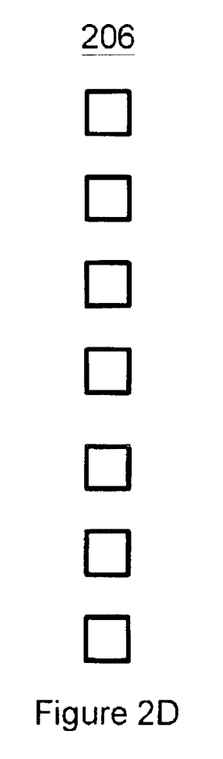
FIG. 2D depicts one embodiment of a fourth, single string, pattern to be provided in the test mask.
Figure 2E:
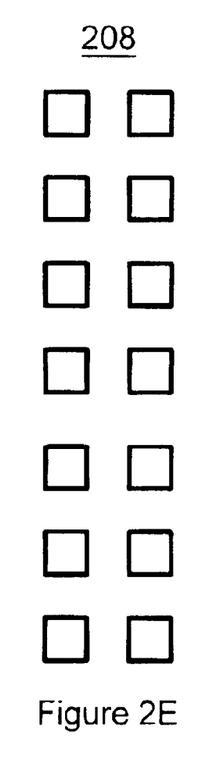
FIG. 2E depicts one embodiment of a fifth, double string, pattern to be provided in the test mask.
Figure 2F:
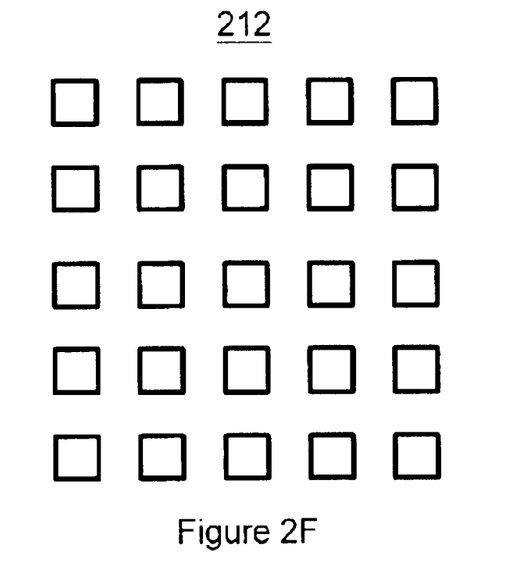
FIG. 2F depicts one embodiment of a sixth pattern to be provided in the test mask.
Figure 2G:
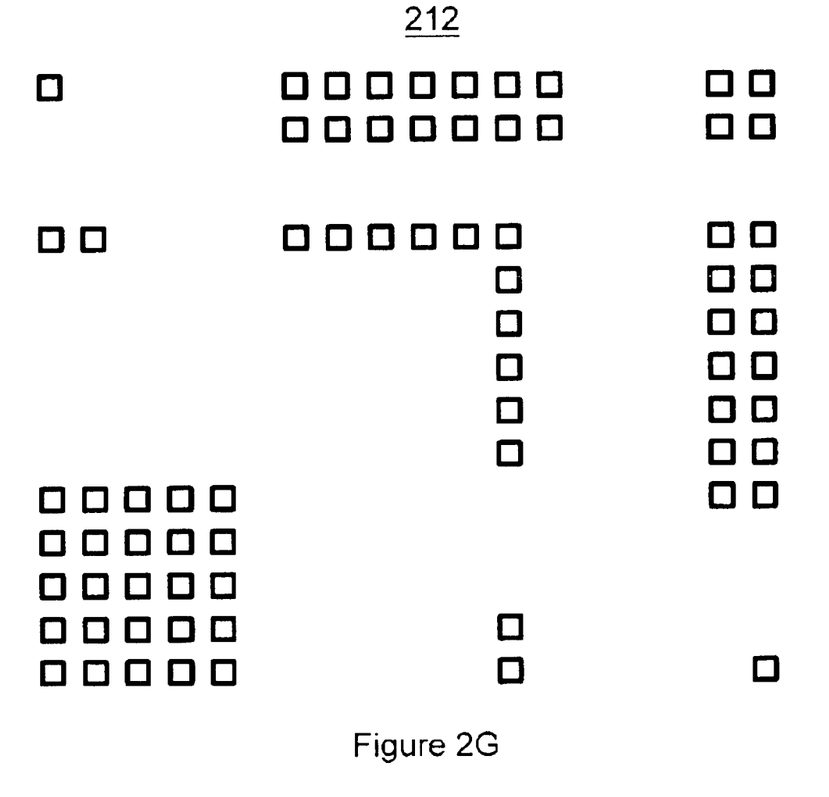
FIG. 2G depicts one embodiment of a set of patterns to be provided in the test mask.

FIGS. 2A–2G depict different patterns that could be provided in the arrays. FIG. 2A depicts one embodiment of a single contact pattern 200 that could be provided in the test mask. FIG. 2B depicts one embodiment of a twin contact pattern 202 that could be provided in the test mask. FIG. 2C depicts one embodiment of a 2×2 pattern 204 that could be provided in the test mask. FIG. 2D depicts one embodiment of a single string pattern 206 that could be provided in the test mask. FIG. 2E depicts one embodiment of a double string pattern 208 that could be provided in the test mask. FIG. 2F depicts one embodiment of a 5×5 pattern 210 that could be provided in the test mask. Some combination of these patterns 200, 202, 204, 206, 208 and 210 is preferably used in each array, at each contact size and pitch. FIG. 2G depicts one embodiment of a set of patterns 212 to be provided in the test mask.

Figure 3:
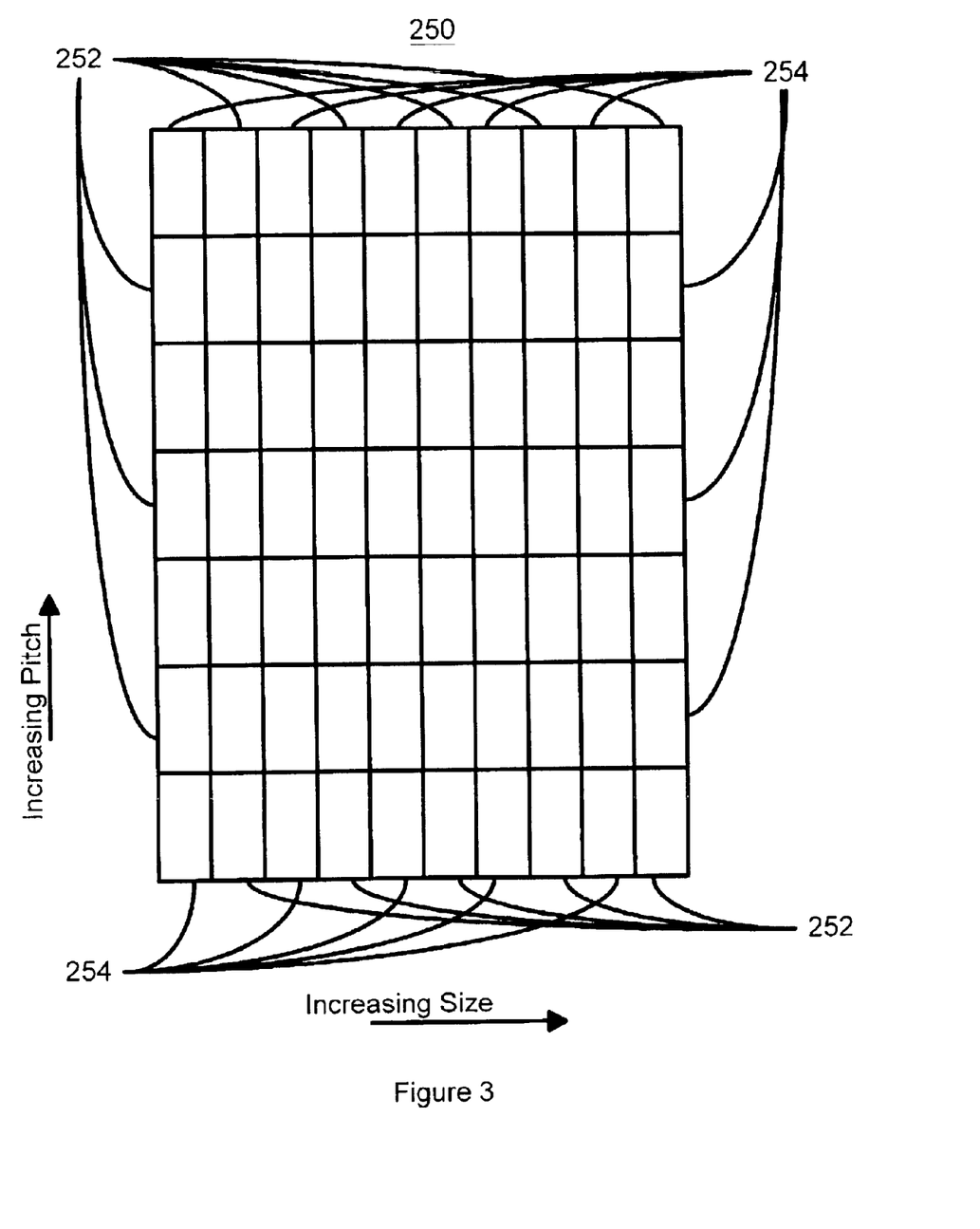
FIG. 3 depicts one embodiment of a first array of patterns having different pitches and contact sizes to be provided in the test mask.

FIG. 3 depicts one embodiment of a test mask 250 first array of patterns having different pitches and contact sizes to be provided in the test mask. The test mask 250 includes regions for 252 and 254 that are for different types of mask materials. Note that only the edge regions 252 and 254 are marked for clarity. Different mask materials are used because the flow rate can depend upon the mask material used as well as the pitch and size of the features. In a preferred embodiment, the regions 252 include patterns for binary type mask materials. For example, regions 252 could be used for phase shift material covered by chromium. The regions 254 are for a particular mask material, such as a phase shift mask material. In each of the regions 252 and 254 a set of patterns is produced for a particular contact size and a particular pitch. Thus, each of the regions 254 and 256 preferably has a unique combination of aperture pitch and aperture size. As a result, each of the regions 254 and 256 would correspond to a unique contact pitch and contact size.

Thus, the flow rate can be determined by comparing the size of the aperture in the test mask with the desired size set when patterning the resist layer. For example, it has been determined that for an isolated contact, as is shown in FIG. 2A, a contact having a desired diameter of one hundred and fifty $\mu$m will result in an aperture in the test mask of approximately one hundred $\mu$m due to the flow rate. However, for the same desired contact size in a pattern having a pitch of three hundred $\mu$m, the aperture in the test mask will be approximately one hundred and thirty $\mu$m. Thus, the flow rate depends upon the pitch of the contacts. As discussed above, the flow rate also depends upon the size of the contact and the mask material used. The size of aperture and thus the flow rate can also depend upon the processing used to provide the apertures in the test mask. Consequently, the processing used to provide the apertures in the test mask in step 104 can also alter the flow rate determined in step 106.

Figure 4:
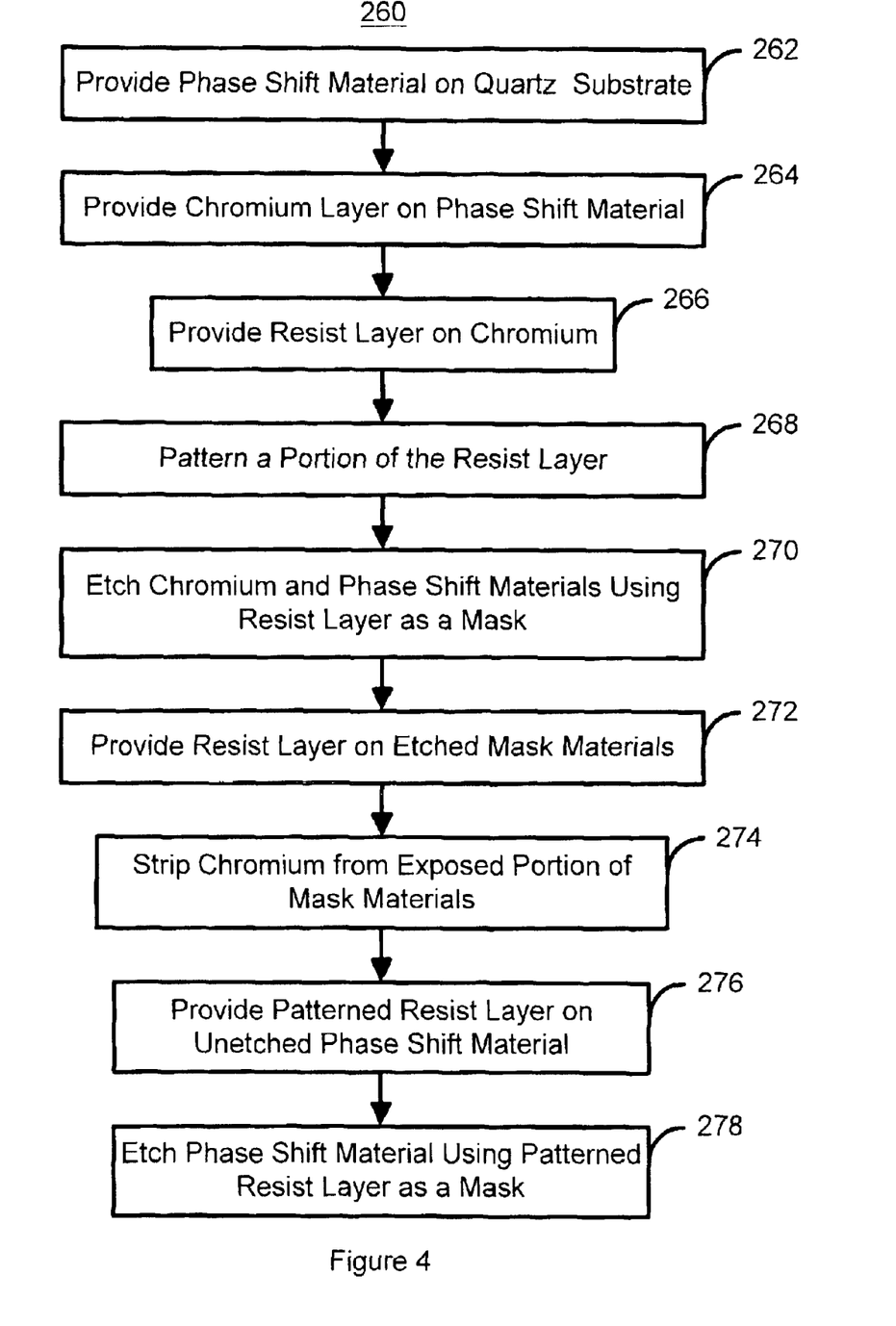
FIG. 4 is a more detailed flow chart of one embodiment of a method in accordance with the present invention for providing an array of patterns having different pitches and contact sizes for a binary and phase shift material mask.
Figure 5A:
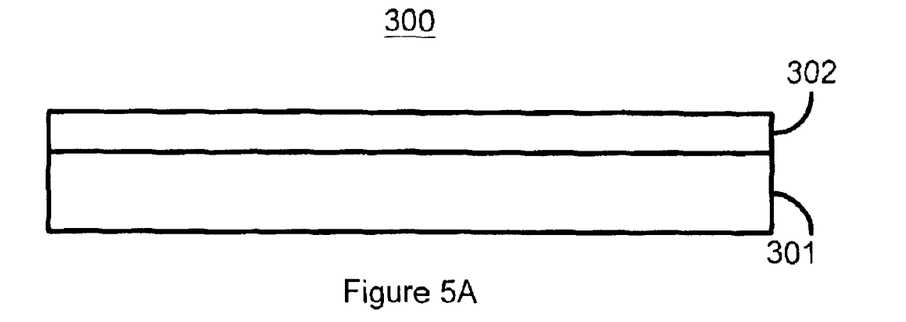
FIGS. 5A–5H depict one embodiment of a portion of a test mask during fabrication.

FIG. 4 is a more detailed flow chart of one embodiment of a method 260 in accordance with the present invention for providing an array of patterns having different pitches and contact sizes for a binary and phase shift material mask. In a preferred embodiment, the method 260 is used to perform step 104 of the method 100. FIGS. 5A–5H depict one embodiment of a portion of a test mask 300 during fabrication. The method 260 is described in conjunction with the test mask 300. Referring to FIGS. 4 and 5A–5H, a phase shift material is provided on a quartz substrate, via step 262. FIG. 5A depicts the phase shift material 302, such as MoSi, on a quartz substrate 301.

Figure 5B:
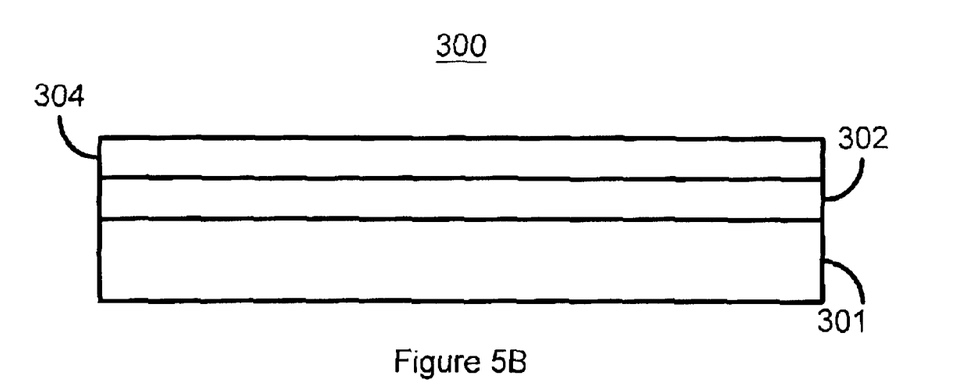
Figure 5C:
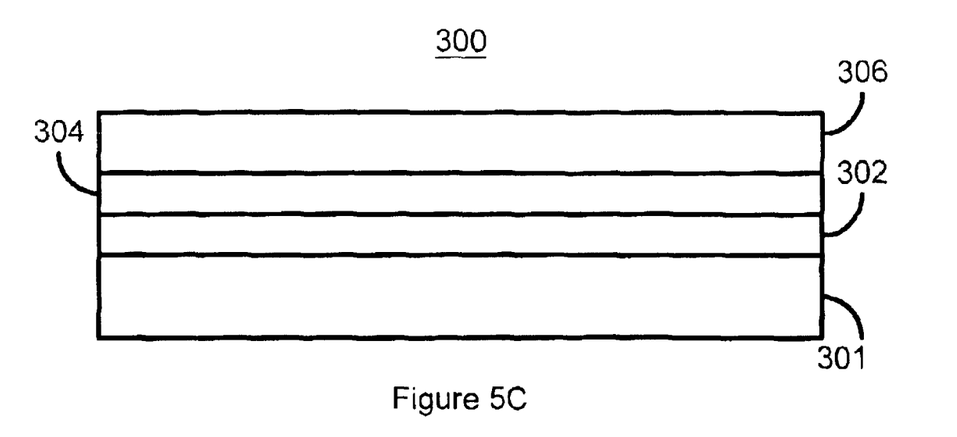
Figure 5D:
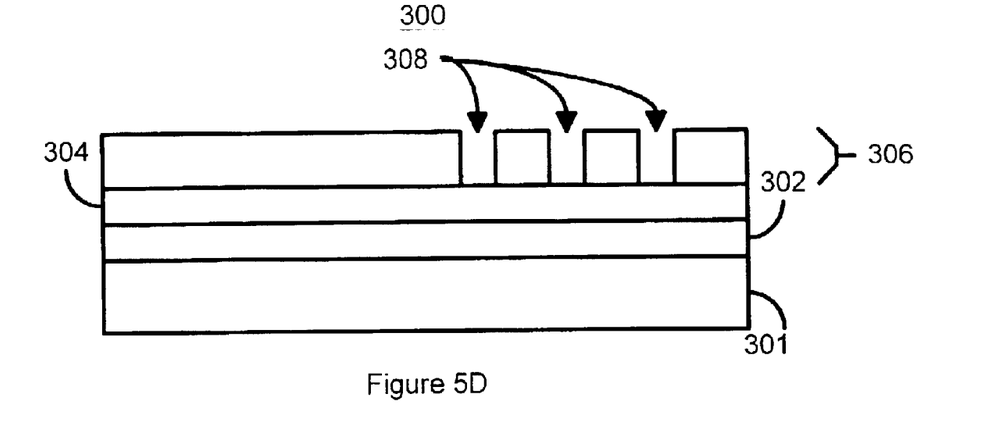
Figure 5E:
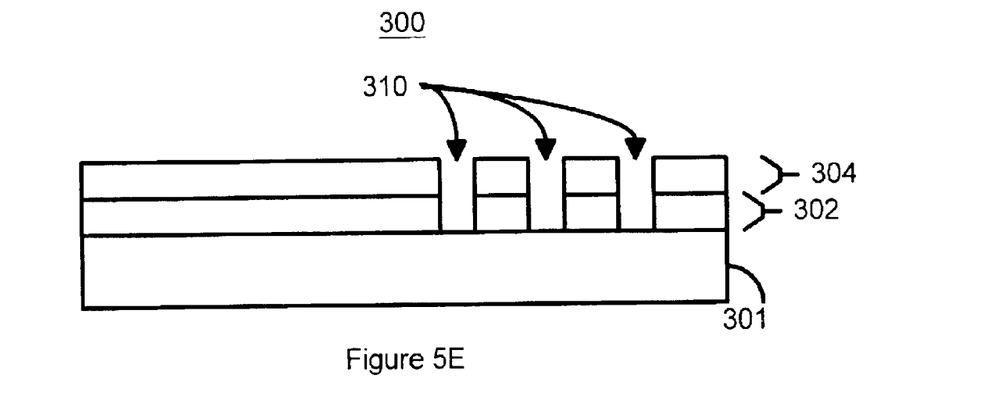

A chrome layer is deposited on the phase shift layer 302, via step 264. FIG. 5B depicts the chrome layer 304 on the phase shift material 302. The chrome 304 and phase shift material 302 are the mask materials in the test mask 300. A layer of resist is provided on the chrome 304, via step 266. FIG. 5C depicts the test mask 300 after deposition of the resist layer 306. In one embodiment, the resist 306 used is an E-beam resist material. In another embodiment, the resist 306 used is a photoresist material. A portion of the resist 306 is patterned, via step 268. FIG. 5D depicts the test mask 300 after apertures 308 have been formed in a portion of the resist 306. The chrome 304 and phase shift material 302 are etched through, via step 270. The resist can then be stripped, FIG. 5E depicts the test mask 300 after apertures 310 have been formed in the chrome 304 and the phase shift material 302 and after the resist 306 has been stripped.

Figure 5F:
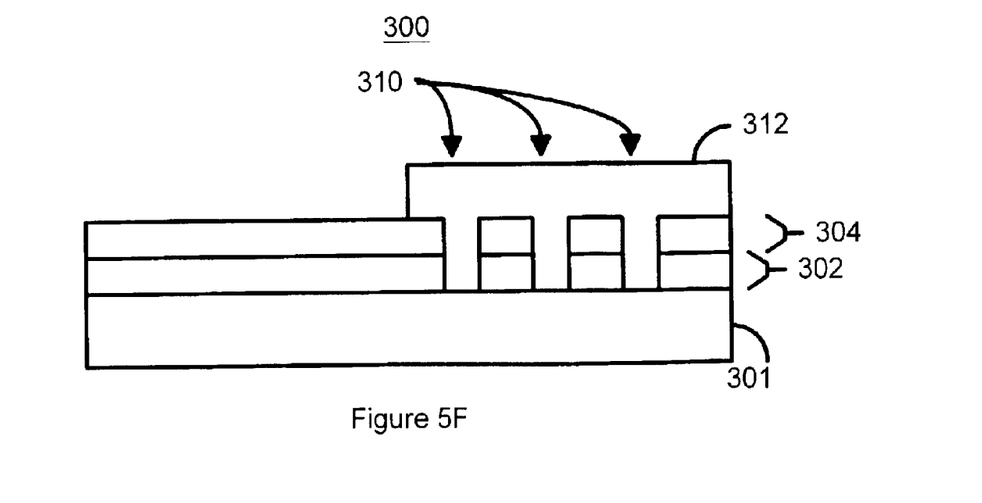
Figure 5G:
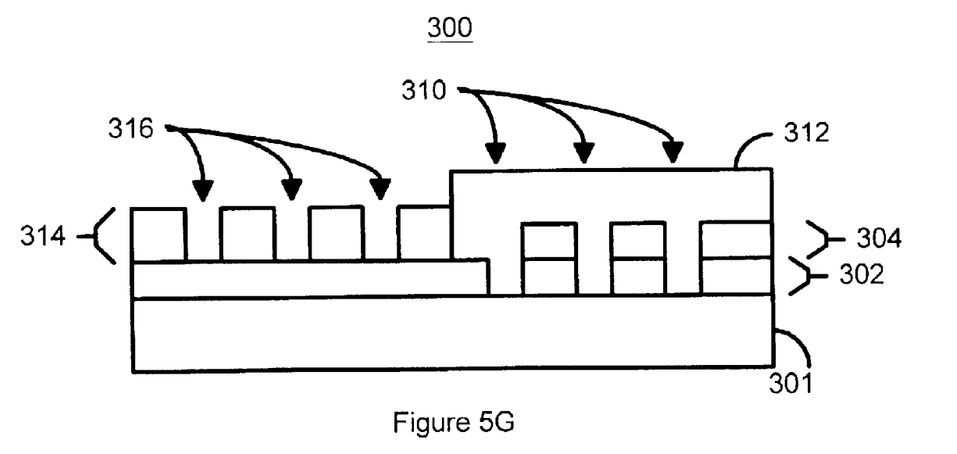
Figure 5H:
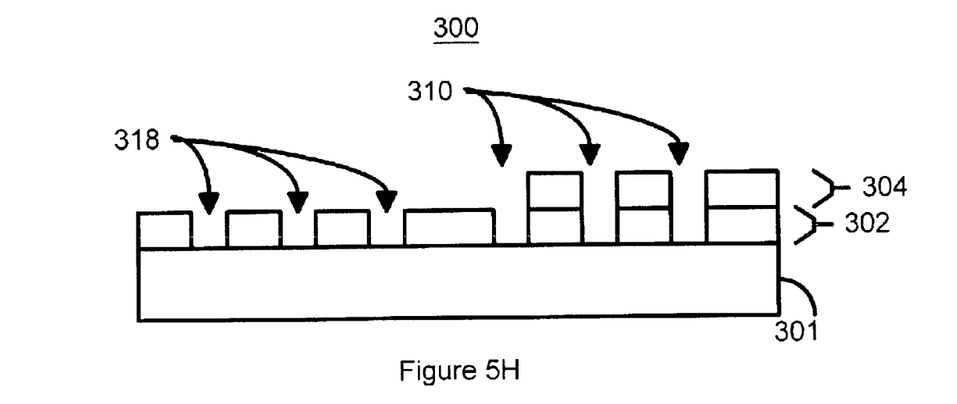

A layer of resist is provided on the portion of the mask materials 302 and 304 that have been etched, via step 272. FIG. 5F depicts the test mask 300 as well as the resist 312 over the region including the apertures 310. In one embodiment, the resist 312 used is an E-beam resist material. In another embodiment, the resist 312 used is a photoresist material. The chrome is removed from the exposed portion of the test mask 300, via step 274. Another layer of resist is provided on the remaining portion of the test mask 300 and patterned, via step 276. FIG. 5G depicts the test mask 300 after the additional layer of resist 314 has been patterned with apertures 316. In one embodiment, the resist 314 used is an E-beam resist material. In another embodiment, the resist 314 used is a photoresist material. The phase shift material is then etched using the resist 314 as a mask, via step 278. The resist 312 and then be stripped. FIG. 5H depicts the test mask 300 after the resist 314 and 312 have been stripped. The test mask 300 includes two regions, one region with only the phase shift material 302 having apertures 318 and another region with both the phase shift material 302 and the chrome 304 having apertures 310. In the test mask 300 shown, both the apertures 318 and the apertures 310 have the same size and pitch. In a preferred embodiment, the test mask 300 would include other regions for both the phase shift material 302 only and the combination of the phase shift material 306 and the having different chrome 304 aperture sizes and/or different pitches. The test mask 300 can thus be used to determine the flow rate of the resist.

Figure 6:
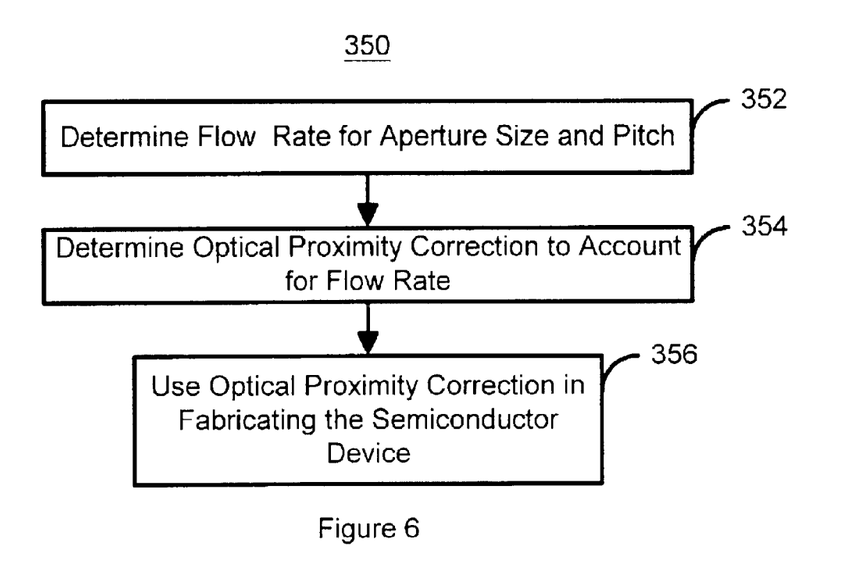
FIG. 6 is a flow chart depicting one embodiment of a method for providing a semiconductor device accounting for the flow rate.

FIG. 6 is a flow chart depicting one embodiment of a method 350 for providing a semiconductor device accounting for the flow rate. The flow rate is determined using the method 100, via step 352. The flow rate depends upon the mask materials used, the contact size and the contact pitch as well as the processing used for the resist. An optical proximity correction that will account for the flow rate for the mask materials, aperture pitch, aperture size and method of fabricating the mask is determined, via step 354. The optical proximity correction is then applied when using the mask to fabricate a semiconductor device, via step 356. As a result, the features provided in the semiconductor device should have the desired dimensions.

A method and system has been disclosed for accounting for the flow rate for a mask used in fabricating a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for determining a mask for fabricating a semiconductor device, the method comprising the steps of:
   (a) patterning a resist layer on at least one mask material to provide a patterned resist layer, the patterned resist layer having a plurality of apertures therein, the plurality of apertures for the plurality of features, the plurality of apertures having a plurality of aperture sizes and a plurality of aperture pitches;
   (b) providing a test mask for a plurality of features using the resist layer, the test mask having the plurality of apertures therein; and
   (c) determining a plurality of flow rates for the plurality of aperture pitches and the plurality of aperture sizes based upon the plurality of features.

2. A method for determining a mask for fabricating a semiconductor device, the method comprising the steps of:
   (a) patterning a resist layer on at least one mask material to provide a patterned resist layer, the patterned resist layer having a plurality of apertures therein, the plurality of apertures for the plurality of features, the plurality of apertures having a plurality of aperture sizes and a plurality of aperture pitches;
   (b) providing a test mask for a plurality of features using the resist layer, the test mask having the plurality of apertures therein, wherein the test mask includes a plurality of regions, each of the plurality of regions having a different mask type, each of the plurality of regions including a portion of the plurality of apertures, each of the portion of the plurality of apertures having the plurality of aperture sizes and the plurality of aperture pitches.

3. A method for determining a mask for fabricating a semiconductor device, the method comprising the steps of:
   (a) patterning a resist layer on at least one mask material to provide a patterned resist layer, the patterned resist layer having a plurality of apertures therein, the plurality of apertures for the plurality of features, the plurality of apertures having a plurality of aperture sizes and a plurality of aperture pitches;
   (b) providing a test mask for a plurality of features using the resist layer, the test mask having the plurality of apertures therein, wherein the test mask includes a plurality of regions, each of the plurality of regions having a different mask type, each of the plurality of regions including a portion of the plurality of apertures, each of the portion of the plurality of apertures having the plurality of aperture sizes and the plurality of aperture pitches, wherein the plurality of regions includes a first region for a chrome mask and a second region for a phase shift mask.

4. The method of claim 1 further comprising the step of:
   (d) determining an optical proximity correction based upon the plurality of flow rates and at least one desired feature size.

5. The method of claim 1 wherein the plurality of features include a plurality of contacts.

6. A method for providing a semiconductor device, the method comprising the steps of:
   (a) patterning a resist layer on at least one mask material to provide a patterned resist layer, the patterned resist layer having a plurality of apertures therein, the plurality of apertures for the plurality of features, the plurality of apertures having a plurality of apertures sizes and a plurality of aperture pitches;
   (b) providing a test mask for a plurality of features using the resist layer, the test mask having the plurality of apertures therein;
   (c) determining a plurality of flow rates for the plurality of aperture pitches and the plurality of aperture sizes based upon the plurality of features;
   (d) determining an optical correction based upon the plurality of flow rates and at least one desired feature size; and
   (e) using the optical correction with the at least one desired feature size, an aperture pitch of the plurality of aperture pitches and an aperture size of the plurality of aperture sizes to provide a resist mask for the semiconductor device.

7. The method of claim 6 wherein the plurality of features includes a plurality of contacts.

\* \* \* \* \*